United States Patent
Kodama et al.

(10) Patent No.: US 9,035,183 B2
(45) Date of Patent: May 19, 2015

(54) CONNECTION STRUCTURE, CONNECTION METHOD AND DIFFERENTIAL SIGNAL TRANSMISSION CABLE

(71) Applicant: HITACHI CABLE, LTD., Tokyo (JP)

(72) Inventors: Sohei Kodama, Hitachi (JP); Kotaro Tanaka, Naka-gun (JP)

(73) Assignee: HITACHI METALS, LTD., Tokyo (JP)

( * ) Notice: Subject to any disclaimer, the term of this patent is extended or adjusted under 35 U.S.C. 154(b) by 77 days.

(21) Appl. No.: 13/693,648

(22) Filed: Dec. 4, 2012

(65) Prior Publication Data

US 2013/0161071 A1 Jun. 27, 2013

(30) Foreign Application Priority Data

Dec. 27, 2011 (JP) ................. 2011-285371

(51) Int. Cl.
*H01R 9/05* (2006.01)
*H05K 1/18* (2006.01)
*H05K 3/34* (2006.01)

(52) U.S. Cl.
CPC ................ *H05K 1/18* (2013.01); *H05K 3/3405* (2013.01); *H05K 2201/1031* (2013.01); *H05K 2201/1034* (2013.01); *H05K 2201/10356* (2013.01)

(58) Field of Classification Search
CPC .................. H05K 1/18; H05K 3/3405; H05K 2201/10356; H05K 2201/1034; H05K 2201/1031

USPC ........ 174/250–268, 51, 88 R, 74 R, 75 C, 78, 174/79, 88 C; 439/578, 581, 497, 898, 499, 439/579

See application file for complete search history.

(56) References Cited

U.S. PATENT DOCUMENTS

| | | | |
|---|---|---|---|
| 6,682,354 B2* | 1/2004 | Carson et al. | 439/63 |
| 7,973,239 B2* | 7/2011 | Koyama et al. | 174/74 R |
| 2013/0264107 A1* | 10/2013 | Meyers | 174/268 |

FOREIGN PATENT DOCUMENTS

| | | |
|---|---|---|
| JP | 58-192475 | 12/1983 |
| JP | 62-86666 | 6/1987 |
| JP | 2001-015187 | 1/2001 |
| JP | 2003-297155 A | 10/2003 |
| JP | 2008-218225 | 9/2008 |

OTHER PUBLICATIONS

JP office action and English translation of Notification of Reasons for Refusal dated Feb. 3, 2015.

* cited by examiner

*Primary Examiner* — Ishwarbhai B Patel
(74) *Attorney, Agent, or Firm* — Roberts Mlotkowski Safran & Cole P.C.

(57) ABSTRACT

A connection structure for connecting an outer conductor of a differential signal transmission cable to a substrate includes a connecting member including a main body portion and a protruding portion protruding from the main body portion. The outer conductor is connected via the connecting member to the substrate. The connecting member is solder-connected to the outer conductor via the main body portion and is solder-connected to the substrate via the protruding portion.

15 Claims, 14 Drawing Sheets

FIG.13

| SHAPE OF CONNECTING MEMBER | EXAMPLE 1 | EXAMPLE 2 | EXAMPLE 3 | COMPARATIVE |
|---|---|---|---|---|
| | RECESSED SHAPE | TROUGH SHAPE | PLATE SHAPE + JIG | - |
| CONCEPTUAL DIAGRAM AT THE TIME OF PRESSING SOLDERING TOOL | 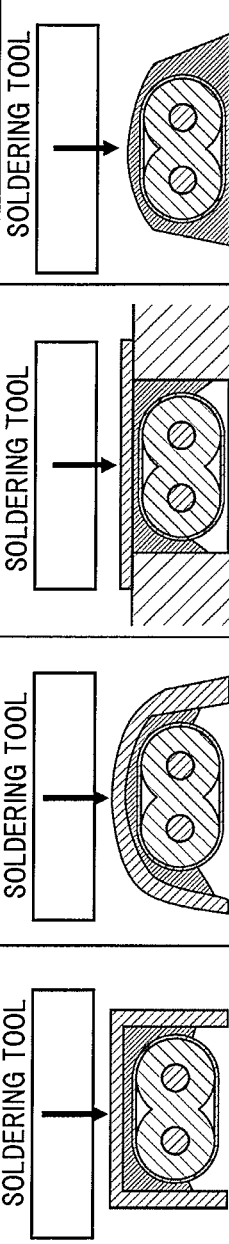 | 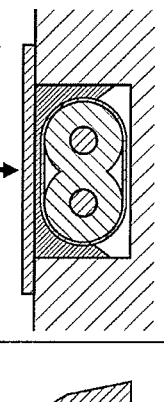 |  | 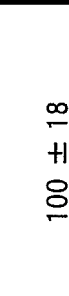 |
| AMOUNT OF COLLAPSE OF CORE (mm) | 0.1 | 0.1 | 0.1 | 0.5 |
| VARIATION IN IMPEDANCE (Ω) | 100 ± 3 | 100 ± 5 | 100 ± 8 | 100 ± 18 |
| COMPREHENSIVE EVALUATION* | ○ (PASSED) | ○ (PASSED) | ○ (PASSED) | × (FAILED) |

* FOR COMPREHENSIVE EVALUATION, ≦100 ± 10Ω OF VARIATION IN IMPEDANCE IS REGARDED AS ○ (PASSED), AND > 100 ± 10Ω IS REGARDED AS × (FAILED).

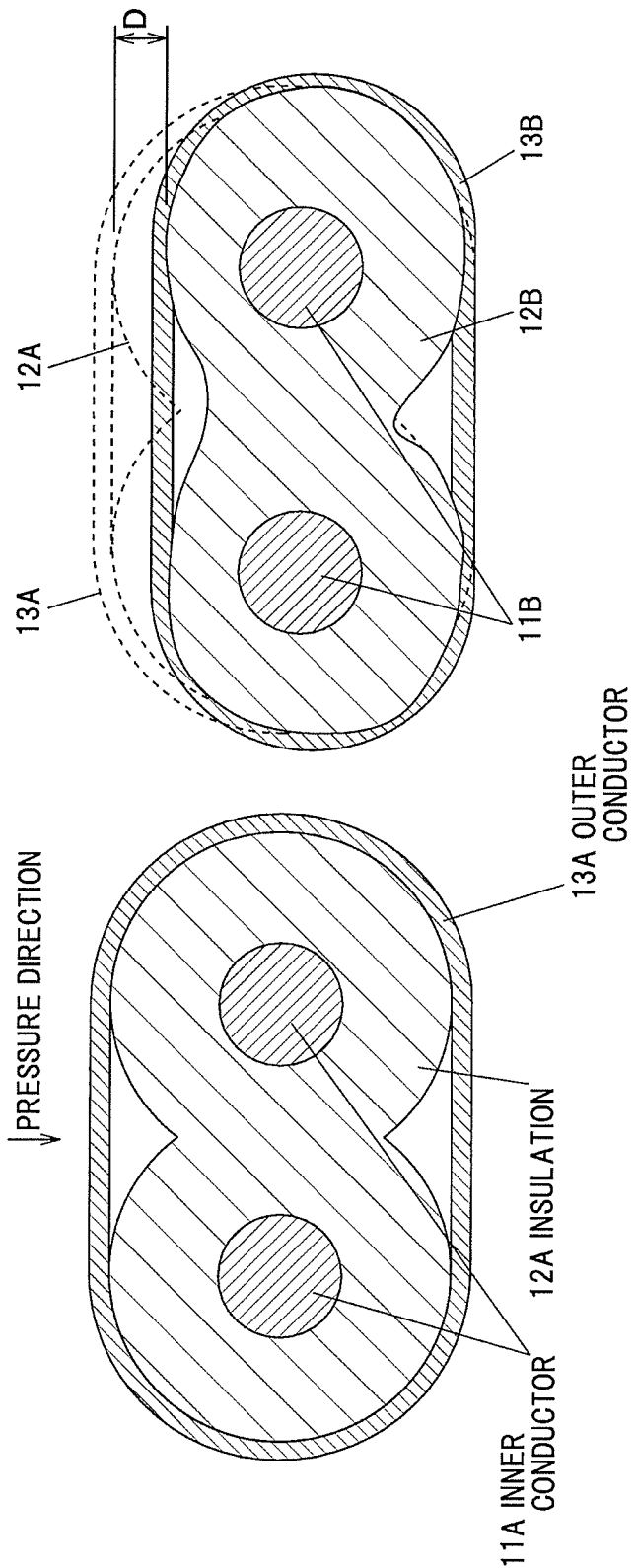

CONNECTION STRUCTURE, CONNECTION METHOD AND DIFFERENTIAL SIGNAL TRANSMISSION CABLE

The present application is based on Japanese patent application No. 2011-285371 filed on Dec. 27, 2011, the entire contents of which are incorporated herein by reference.

BACKGROUND OF THE INVENTION

1. Field of the Invention

The invention relates to a connection structure between a differential signal transmission cable and a substrate, a connection method for connecting a differential signal transmission cable to a substrate, and a differential signal transmission cable.

2. Description of the Related Art

In connecting a differential signal transmission cable to a substrate, it is necessary to connect an outer conductor exposed at an end portion of the cable to a ground electrode on the substrate for grounding.

As a method of connecting the outer conductor to the ground electrode on the substrate, there is a method in which the outer conductor is directly connected to the ground electrode on the substrate using a solder.

On the other hand, there is a method in which a drain wire provided along the cable is brought into contact with the outer conductor and is then connected to the ground electrode on the substrate using a solder (see, e.g., JP-A-2003-297155).

SUMMARY OF THE INVENTION

In the method of directly connecting the outer conductor to the ground electrode on the substrate using the solder, there is a problem that an insulation inside the cable is deformed or melted by thermal stress or heat during solder connection work and transmission characteristics thus deteriorate.

In the method of connecting the drain wire to the ground electrode of the substrate using the solder, there is a problem that it is difficult to meet the recent needs of further improvement in transmission characteristics since transmission characteristics deteriorate due to deformation of the insulation caused by the drain wire.

Accordingly, it is an object of the invention to provide a connection structure that can prevent the deterioration of the transmission characteristics by preventing the deformation and melting of an insulation during the solder connection work, as well as a connection method and a differential signal transmission cable.

(1) According to one embodiment of the invention, a connection structure for connecting an outer conductor of a differential signal transmission cable to a substrate comprises:

a connecting member comprising a main body portion and a protruding portion protruding from the main body portion, wherein the outer conductor is connected via the connecting member to the substrate, and wherein the connecting member is solder-connected to the outer conductor via the main body portion and is solder-connected to the substrate via the protruding portion.

In the above embodiment (1) of the invention, the following modifications and changes can be made.

(i) The connecting member is not directly in contact with an upper surface of the outer conductor.

(ii) The connecting member is not directly in contact with a side surface of the outer conductor.

(iii) The main body portion of the connecting member comprises a protective shape formed so as to prevent a soldering tool pressing load from being applied to the outer conductor during a solder connection to the outer conductor.

(iv) The protective shape comprises a recessed shape comprising an upper wall facing the upper surface of the outer conductor and a sidewall facing the side surface of the outer conductor.

(v) The protective shape comprises a trough shape.

(vi) The main body portion of the connecting member comprises a plate shape comprising an upper wall facing the upper surface of the outer conductor.

(vii) The protruding portion is formed protruding substantially parallel to an inner conductor exposed at an end portion of the differential signal transmission cable.

(viii) The protruding portion is formed protruding so as to be substantially at a same level as the inner conductor exposed at the end portion of the differential signal transmission cable.

(ix) The protruding portion is formed protruding substantially orthogonal to the inner conductor exposed at an end portion of the differential signal transmission cable.

(x) The connecting member is solder-connected to each outer conductor of two or more differential signal transmission cables that are arranged in parallel.

(xi) The connecting member is solder-connected to each outer conductor of a differential signal transmission cable connected to a front surface of the substrate and a differential signal transmission cable connected to a back surface of the substrate.

(2) According to another embodiment of the invention, a connection method comprises:

connecting the outer conductor to the substrate via the connecting member of the connection structure according to the above embodiment (1), wherein the connecting member is solder-connected to the outer conductor by heating and melting a solder through the connecting member.

(3) According to another embodiment of the invention, a connection method comprises:

connecting the outer conductor to the substrate via the connecting member of the connection structure according to the above embodiment (1) (vi), wherein the connecting member is solder-connected to the outer conductor by using a jig formed so as to support the connecting member and to prevent a soldering tool pressing load from being applied to the outer conductor during a solder connection to the outer conductor by being used together with the connecting member.

In the above embodiment (3) of the invention, the following modifications and changes can be made.

(xii) The jig comprises a rectangular parallelepiped shape and a recessed portion for housing the outer conductor on an upper surface thereof.

(4) According to another embodiment of the invention, a differential signal transmission cable used for the connection structure according to the above embodiment (1), wherein the connecting member is solder-connected to the outer conductor exposed at one end or both ends of the cable.

EFFECTS OF THE INVENTION

According to one embodiment of the invention, a connection structure can be provided that can prevent the deterioration of the transmission characteristics by preventing the deformation and melting of an insulation during the solder connection work, as well as a connection method and a differential signal transmission cable.

BRIEF DESCRIPTION OF THE DRAWINGS

Next, the present invention will be explained in more detail in conjunction with appended drawings, wherein:

FIG. 13 is a table showing test results of Examples 1 to 3 and Comparative Example 1; and FIGS. 14A and 14B are explanatory diagrams illustrating an amount of collapse of an insulation, wherein FIG. 14A is a cross sectional view before pressing by the soldering tool and FIG. 14B is a cross sectional view after pressing by the soldering tool.

DETAILED DESCRIPTION OF THE PREFERRED EMBODIMENTS

First Embodiment

Figure 1:
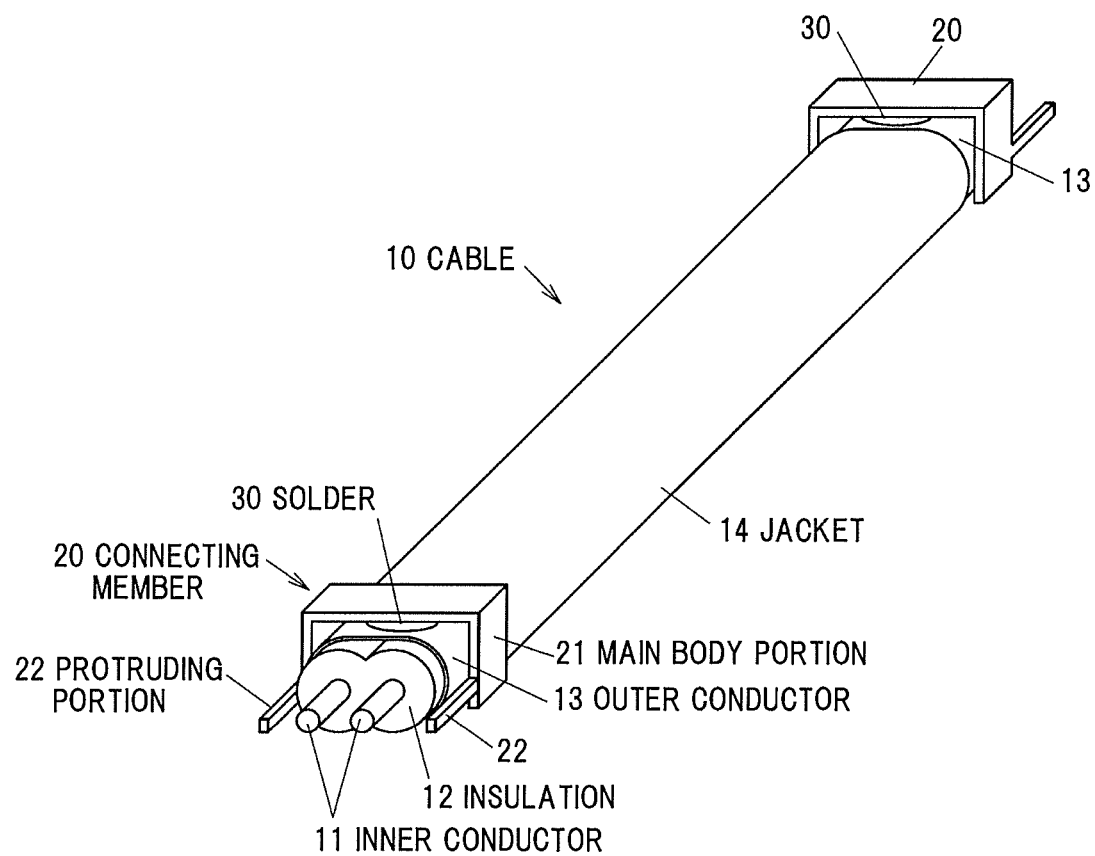
FIG. 1 is a perspective view showing a differential signal transmission cable used in a connection structure in a first embodiment of the present invention.
Figure 2:
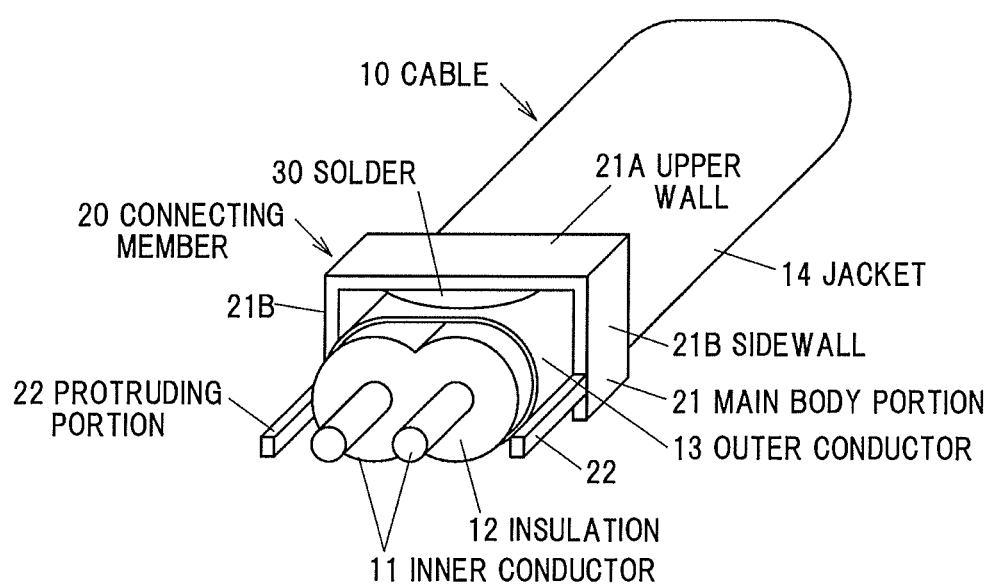
FIG. 2 is an enlarged view showing an end portion in FIG. 1.

Structure of Differential Signal Transmission Cable Used in Connection Structure FIG. 1 is a perspective view showing a differential signal transmission cable used in a connection structure in a first embodiment of the invention and FIG. 2 is an enlarged view showing an end portion in FIG. 1.

A differential signal transmission cable used in a connection structure in the first embodiment is provided with a cable 10 and connecting members 20 connected to an outer conductor 13 exposed at both ends of the cable 10 using a solder 30. The connecting member 20 may be connected to only one end of the cable 10 (the same applies to the second and subsequent embodiments).

As the cable 10, a differential signal transmission cable can be used that is composed of a pair of inner conductors 11, an insulation 12, the outer conductor 13 and a jacket (sheath) 14. A drain wire is not required since it is possible to ground through the connecting member 20.

The connecting member 20 is provided with a main body portion 21 formed in a protective shape which prevents a soldering tool pressing load during solder connection to the outer conductor 13 from being applied to the outer conductor 13. The protective shape in the first embodiment is a recessed shape composed of an upper wall 21A facing an upper surface of the outer conductor 13 and sidewalls 21B facing side surfaces of the outer conductor 13. Here, it is preferable that the upper wall 21A be not directly in contact with the upper surface of the outer conductor 13. In addition, it is preferable that the sidewalls 21B be not directly in contact with the side surfaces of the outer conductor 13.

The connecting member 20 is provided with protruding portions 22 and is connected to ground electrodes of a substrate via the protruding portions 22. The protruding portions 22 are formed to protrude, one from each of the both sidewalls 21B in a direction substantially parallel to the inner conductors 11 exposed at an end portion of the cable 10. The shape of the protruding portion 22 is not specifically limited but is desirably a shape having strength not to be bent easily. The length of the protruding portion 22 is not specifically limited, neither, and it is possible to appropriately adjust the length.

Figure 6A:
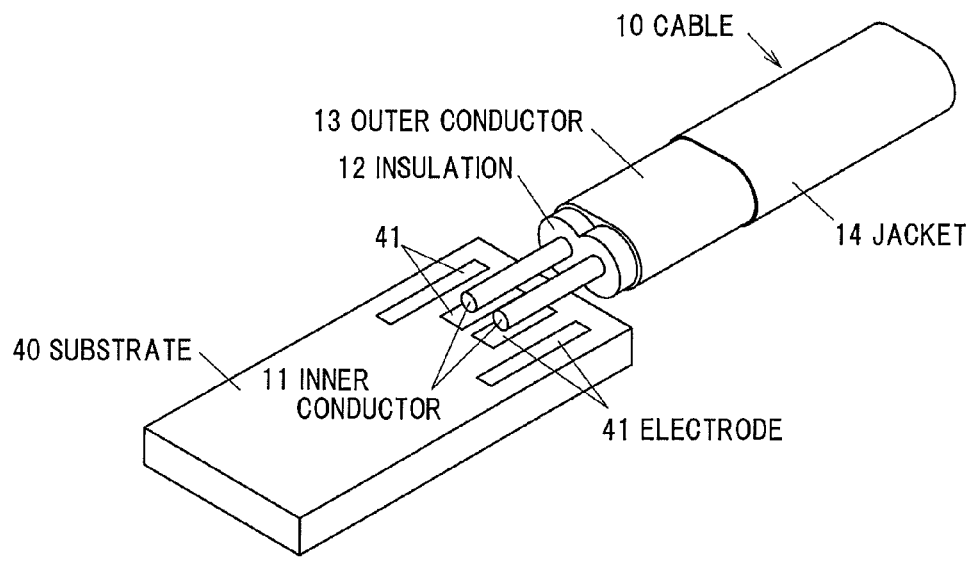
FIGS. 6A and 6B are explanatory diagrams illustrating a connection procedure for the connection structure in the first embodiment of the invention.
Figure 6B:
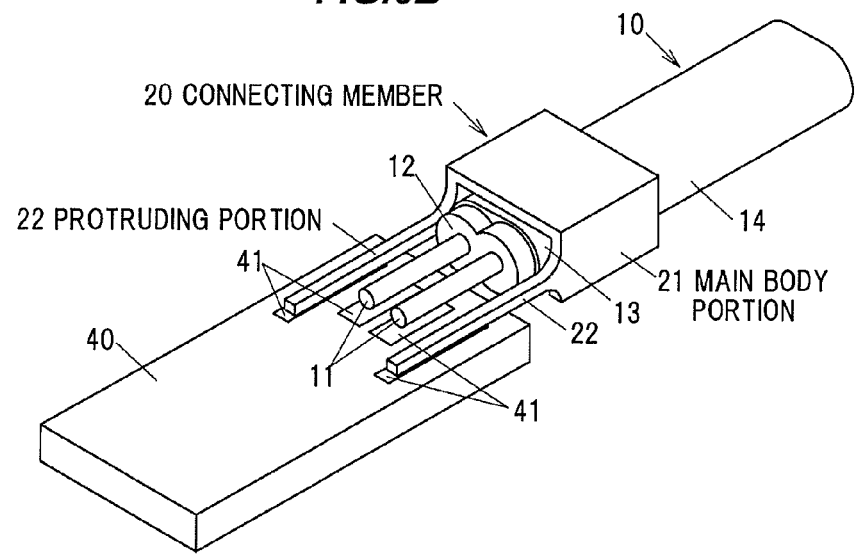

It is preferable that the protruding portions 22 be formed protruding so as to be substantially at the same level (or height) as the inner conductors 11 exposed at an end portion of the cable 10, as shown in FIG. 2. Although the protruding portions 22 can be formed to protrude from the lowermost portions of the sidewalls 21B as is a modification described later (FIGS. 7A and 7B), the same level as the inner conductors 11 is preferable since the inner conductors 11 do not need to be downwardly bent (see FIGS. 7A and 7B) and can be connected to the substrate in a straight state as shown in FIGS. 6A and 6B which illustrate a below-described connection procedure.

A width of the upper wall 21A is not less than a width of the cable 10 to be housed and is preferably greater than the width of the cable 10 and less than a pitch. The pitch here means, when two or more cables 10 are arranged in parallel, a length which is the sum of a width of a cable 10 and a distance between the cable 10 and a cable 10 adjacent thereto. If the width of the upper wall 21A is not less than the pitch, a connecting member 20 connected to the cable 10 and a connecting member 20 connected to the adjacent cable 10 interfere with each other.

In addition, a height of the sidewall 21B is not less than a height of the cable 10 to be housed and is preferably greater than the height of the cable 10 and less than a height causing interference with inside of a case for housing the cable 10 solder-connected to the substrate.

A material of the connecting member 20 is not specifically limited as long as the material allows heat of a soldering tool to be transferred to a solder through the connecting member 20 and has an electric conductivity, and it is possible to use materials such as SUS, copper, silver and aluminum.

The protective shape is a recessed shape composed of the upper wall 21A facing the upper surface of the outer conductor 13 and the sidewalls 21B facing the side surfaces of the outer conductor 13 in the first embodiment, but may be a trough shape which does not have corners which are present on the recessed shape.

Connection Procedure for Connection Structure

FIGS. 6A and 6B are explanatory diagrams illustrating a connection procedure for the connection structure in the first embodiment of the invention.

The connection procedure for the connection structure in the first embodiment of the invention may be such that the cable 10 to which the connecting member 20 shown in FIGS. 1 and 2 is already connected using the solder 30 is connected to a substrate 40, or alternatively, the procedure may be such that, as shown in FIGS. 6A and 6B, the inner conductors 11 of the cable 10 are firstly connected to electrodes 41 of the substrate 40 using a solder (not illustrated) (FIG. 6A) and connection of the outer conductor 13 of the cable 10 to the connecting member 20 and connection of the protruding portions 22 of the connecting member 20 to the electrodes (ground electrodes) 41 of the substrate 40 are subsequently carried out using a solder (not illustrated) (FIG. 6B).

For solder connection of the connecting member 20 to the outer conductor 13, it is preferable that the solder be melted by heating through the connecting member 20 in order to prevent deformation/melting of the insulation 12.

Figure 7A:
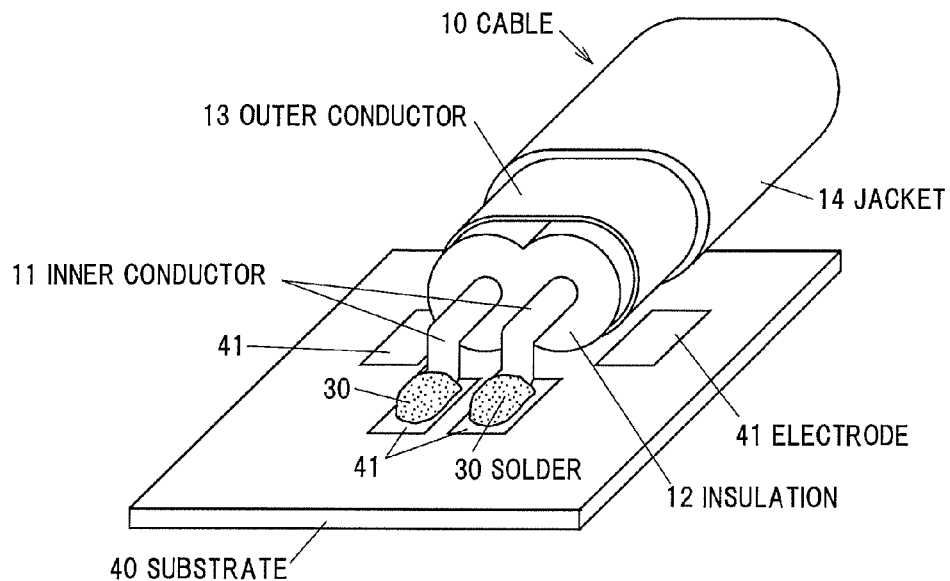
FIGS. 7A and 7B are explanatory diagrams illustrating a connection procedure for a modification of the connection structure in the first embodiment of the invention.
Figure 7B:
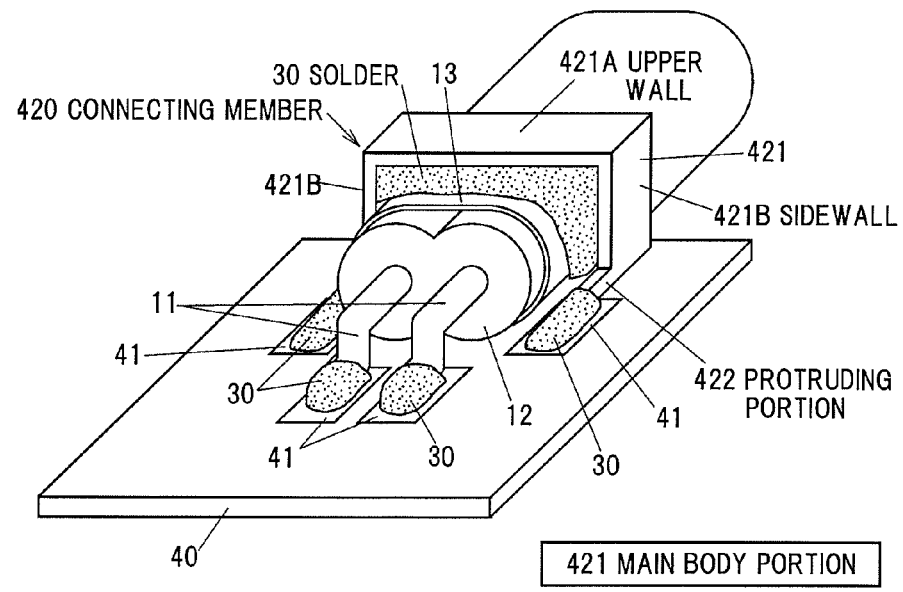

FIGS. 7A and 7B are explanatory diagrams illustrating a connection procedure for a modification of the connection structure in the first embodiment of the invention. This modification is different from the first embodiment only in that protruding portions 422 are formed to protrude from the lowermost portions of sidewalls 421B and it is possible to connect in the same manner as the connection procedure for the connection structure in the first embodiment. However, it is necessary to downwardly bend the inner conductors 11 when connecting the inner conductors 11 to the electrodes 41 of the substrate 40.

Effects of the First Embodiment

The first embodiment achieves the following effects.

(1) It is possible to provide a connection structure which can prevent deterioration of transmission characteristics by preventing the deformation and melting of an insulation during the solder connection work, a connection method and a differential signal transmission cable.

(2) It is possible to solder-connect the connecting member to the substrate by the same method as a conventional method of solder-connecting the outer conductor to the substrate, which allows the connection reliability and connection strength to be sufficiently ensured.

Second Embodiment

Figure 3A:
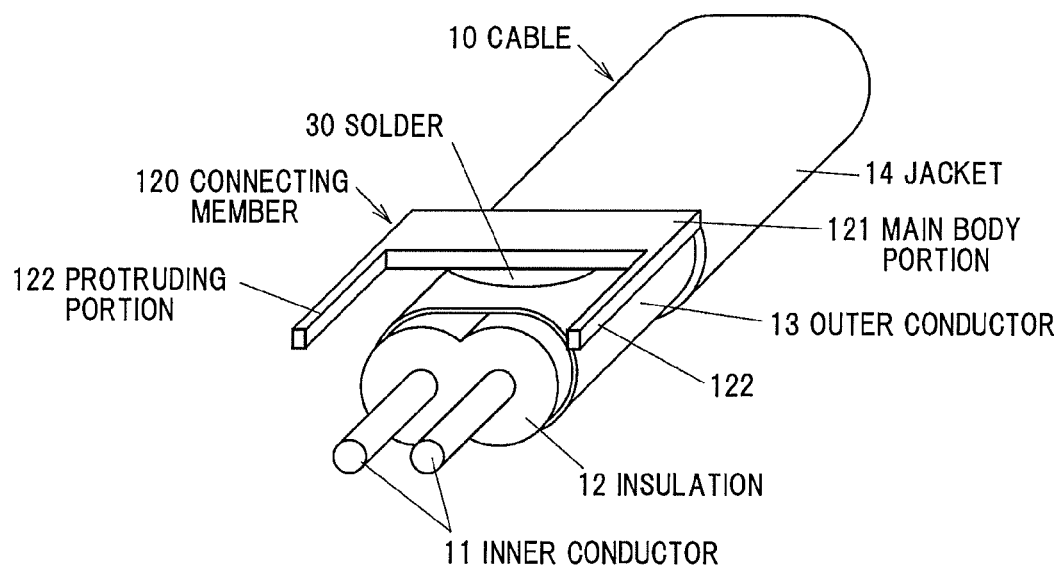
FIG. 3A is a perspective view showing an end portion of a differential signal transmission cable used in a connection structure in a second embodiment of the invention and FIG. 3B is an explanatory diagram illustrating connection of a connecting member to the differential signal transmission cable used in the connection structure in the second embodiment of the invention.
Figure 3B:
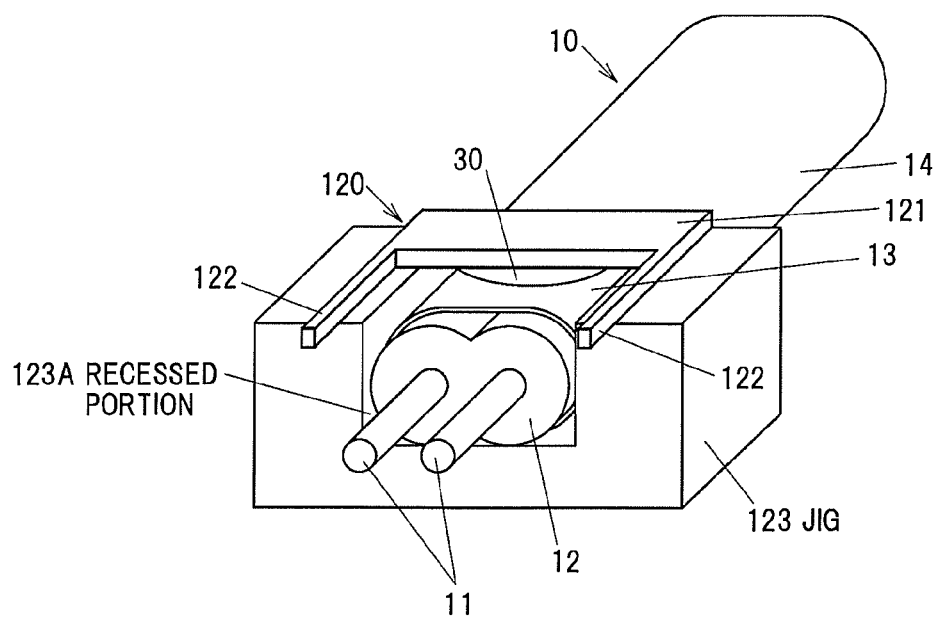

Structure of Differential Signal Transmission Cable Used in Connection Structure FIG. 3A is a perspective view showing an end portion of a differential signal transmission cable used in a connection structure in a second embodiment of the invention and FIG. 3B is an explanatory diagram illustrating connection of a connecting member to the differential signal transmission cable used in the connection structure in the second embodiment of the invention.

A differential signal transmission cable used in a connection structure in the second embodiment is provided with the cable 10 and a connecting member 120 connected to the outer conductor 13 exposed at one end of the cable 10 using the solder 30.

The connecting member 120 has a main body portion 121 formed of a plate-like upper wall facing the upper surface of the outer conductor 13. Here, it is preferable that the main body portion 121 be not directly in contact with the upper surface of the outer conductor 13.

The connecting member 120 is provided with protruding portions 122 and is connected to ground electrodes of a substrate via the protruding portions 122. The protruding portions 122 are formed to protrude, one from each of both side portions of the main body portion 121 in a direction substantially parallel to the inner conductors 11 exposed at an end portion of the cable 10. The shape and length of the protruding portion 122 are adjusted under the similar conditions to those for the protruding portion 22 in the first embodiment.

A width of the main body portion 121 is not less than the width of the cable 10 and is preferably greater than the width of the cable 10 and less than a pitch in the same manner as the width of the upper wall 21A in the first embodiment.

As a material of the connecting member 120, it is possible to use the same material as the connecting member 20 in the first embodiment.

Next, a connection method for connecting the connecting member 120 used in the connection structure of the second embodiment to the outer conductor 13 will be described.

The connecting member 120 is solder-connected to the outer conductor 13 using a jig 123 having a shape which supports the connecting member 120 and can prevent, by using the connecting member 120 together, a soldering tool pressing load during solder connection to the outer conductor 13 from being applied to the outer conductor 13. The jig 123 has, e.g., a rectangular parallelepiped shape and has, on the upper surface thereof, a recessed portion 123A for housing the outer conductor 13 as shown in FIG. 3B.

For solder connection of the connecting member 120 to the outer conductor 13, it is preferable that the solder be melted by heating through the connecting member 120 in order to prevent deformation/melting of the insulation 12.

Connection Procedure for Connection Structure

Figure 8A:
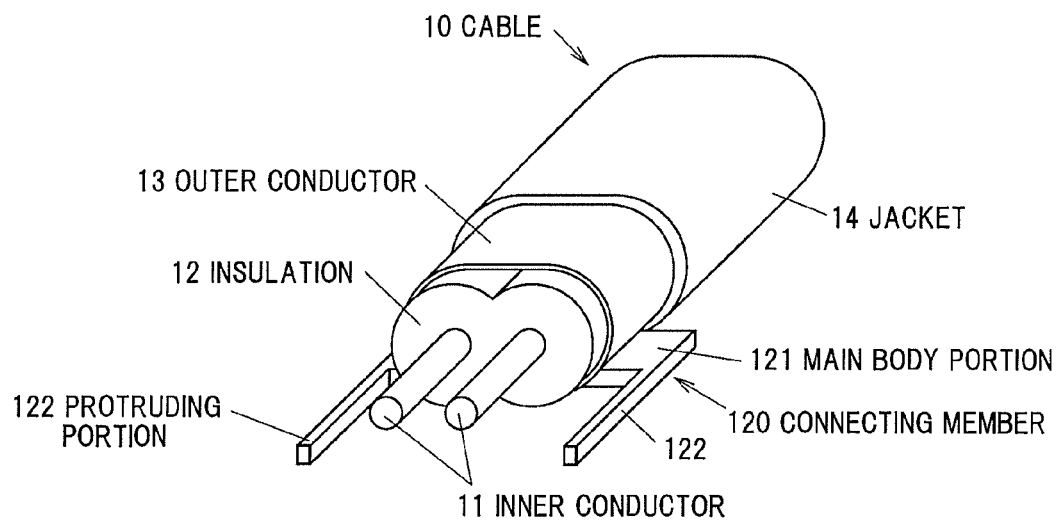
FIGS. 8A and 8B are perspective views showing a connection procedure for the connection structure in the second embodiment of the invention.
Figure 8B:
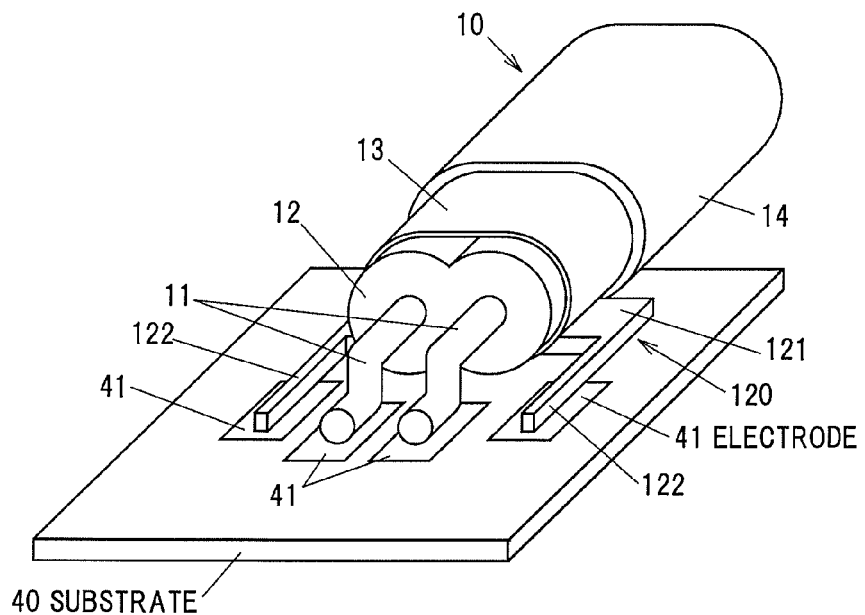

FIGS. 8A and 8B are perspective views showing a connection procedure for the connection structure in the second embodiment of the invention.

The connection procedure for the connection structure in the second embodiment of the invention is such that the connecting member 120 is connected to the outer conductor 13 of the cable 10 using a solder as shown in FIGS. 3A and 3B and, as shown in FIGS. 8A and 8B, the cable 10 having the connecting member 120 connected thereto is subsequently turned over 180° (FIG. 8A) and is then arranged so that the inner conductors 11 of the cable 10 are in contact with the electrodes 41 of the substrate 40 and also the protruding portions 122 of the connecting member 120 are in contact with the electrodes (ground electrodes) 41 of the substrate 40, and then, connection of the inner conductors 11 to the electrodes 41 and connection of the protruding portions 122 to the electrodes (ground electrodes) 41 are carried out using a solder (not illustrated) (FIG. 8B). Note that, it is necessary to downwardly bend the inner conductors 11 when connecting the inner conductors 11 to the electrodes 41 of the substrate 40 in the same manner as the modification of the first embodiment (see FIGS. 7A and 7B).

Effects of the Second Embodiment

The second embodiment achieves the following effects.

(1) It is possible to provide a connection structure which can prevent deterioration of transmission characteristics by preventing deformation and melting of an insulation during solder connection work, a connection method and a differential signal transmission cable.

(2) Since the connecting member 120 is a flat plate and there is no need of process such as bending, it is possible to manufacture easily at low cost. In addition, use of the jig 123 allows the cable 10 to be properly arranged at the same time when solder-connecting the connecting member 120.

Figure 4:
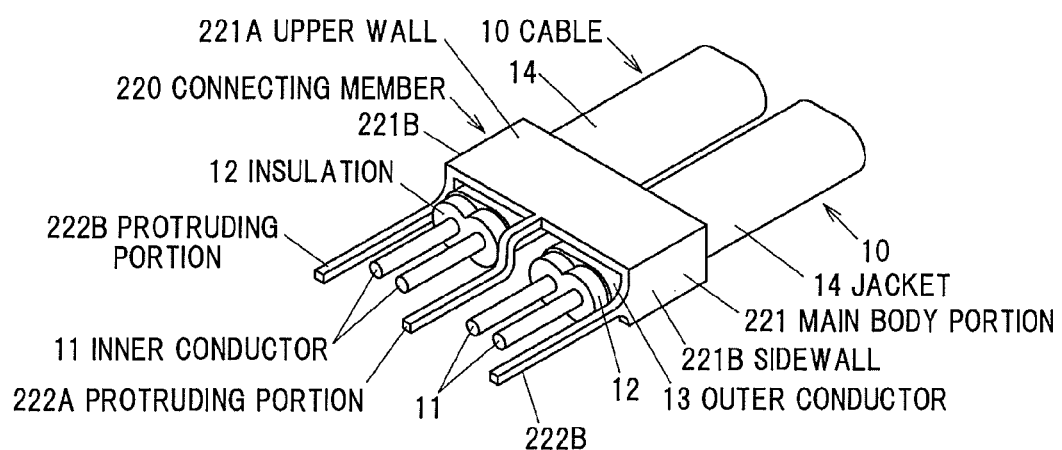
FIG. 4 is a perspective view showing an end portion of a differential signal transmission cable used in a connection structure in a third embodiment of the invention.

Third Embodiment
Structure of Differential Signal Transmission Cable Used in Connection Structure FIG. 4 is a perspective view showing an end portion of a differential signal transmission cable used in a connection structure in a third embodiment of the invention.

A differential signal transmission cable used in a connection structure in the third embodiment is provided with two cables 10 arranged in parallel and a connecting member 220 connected to the outer conductor 13 exposed at one end of each cable 10 using the solder 30.

The connecting member 220 is provided with a main body portion 221 formed in a protective shape which prevents a soldering tool pressing load during solder connection to the outer conductor 13 from being applied to the outer conductor 13. The protective shape in the third embodiment is a recessed shape composed of an upper wall 221A facing the upper surfaces of the outer conductors 13 and sidewalls 221B facing the side surfaces of the outer conductors 13. Here, it is preferable that the upper wall 221A be not directly in contact with the upper surfaces of the outer conductors 13. In addition, it is preferable that the sidewalls 221B be not directly in contact with the side surfaces of the outer conductors 13.

The connecting member 220 is provided with protruding portions 222A and 222B and is connected to ground electrodes of a substrate via the protruding portions 222A and 222B. The protruding portions 222A and 222B are formed to protrude one (the protruding portion 222A) from the middle of the upper wall 221A and one (the protruding portion 222B) from each of the both sidewalls 221B in a direction substantially parallel to the inner conductors 11 exposed at an end portion of the cable 10. The shape and length of the protruding portions 222A and 222B are adjusted under the similar conditions to those for the protruding portion 22 in the first embodiment.

In the same manner as the first embodiment, it is preferable that the protruding portions 222A and 222B be formed in a protruding manner so as to be substantially at the same level (or height) as the inner conductors 11 exposed at an end portion of the cable 10, as shown in FIG. 4.

A width of the upper wall 221A is not less than a total of widths of the two cables 10 to be housed and a distance between the cables, and is preferably greater than the total value and less than the pitch×2 (i.e., (the same pitch as in the first and second embodiments)×(the number of the cables 10 to be housed)). In addition, the height of the sidewall 221B is adjusted in the same manner as the sidewall 21B in the first embodiment.

As a material of the connecting member 220, it is possible to use the same material as the connecting member 20 in the first embodiment.

The number of the cables 10 to be housed is two in the third embodiment but may be three or more. In such a case, it is desirable that the protruding portion 222A is formed in each gap between the cables 10 so as to protrude from the upper wall 221A.

Connection Procedure for Connection Structure

Figure 9A:
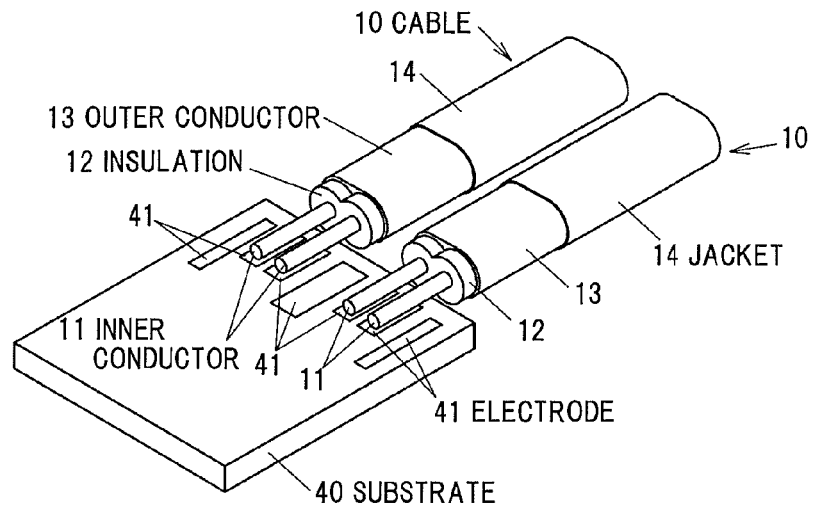
FIGS. 9A and 9B are explanatory diagrams illustrating a connection procedure for the connection structure in the third embodiment of the invention.
Figure 9B:
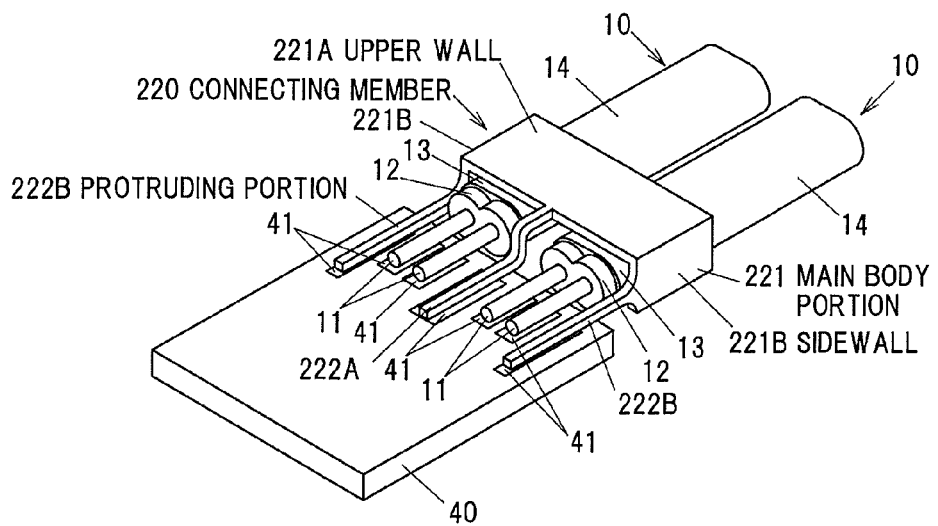

FIGS. 9A and 9B are explanatory diagrams illustrating a connection procedure for the connection structure in the third embodiment of the invention.

The connection procedure for the connection structure in the third embodiment of the invention may be such that the cables 10 to which the connecting member 220 shown in FIG. 4 is already connected using the solder 30 are connected to the substrate 40, or alternatively, the procedure may be such that, as shown in FIGS. 9A and 9B, the inner conductors 11 of the two cables 10 are firstly connected to the electrodes 41 of the substrate 40 using a solder (not illustrated) (FIG. 9A) and connection of the outer conductors 13 of the cables 10 to the connecting member 20 and connection of the protruding portions 222A and 222B of the connecting member 220 to the electrodes (ground electrodes) 41 of the substrate 40 are subsequently carried out using a solder (not illustrated) (FIG. 9B).

For solder connection of the connecting member 220 to the outer conductors 13, it is preferable that the solder be melted by heating through the connecting member 220 in order to prevent deformation/melting of the insulation 12.

Figure 10:
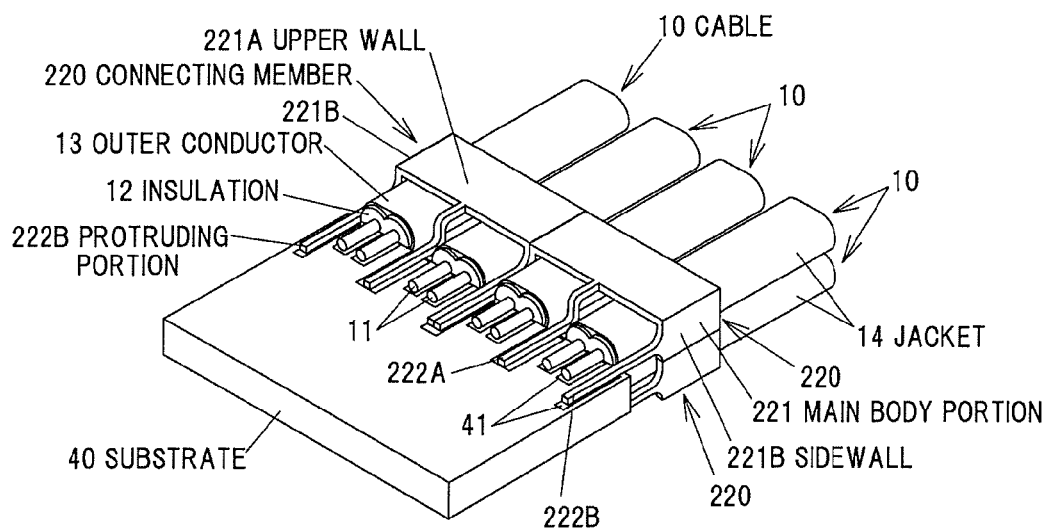
FIG. 10 is a perspective view showing a modification of the connection structure in the third embodiment of the invention.

FIG. 10 is a perspective view showing a modification of the connection structure in the third embodiment of the invention.

This modification is configured to have a structure in which four connection structures of the third embodiment, two each in a height direction and a width direction, are coupled. That is, four coupled connecting members 220 are respectively solder-connected to the outer conductors 13 of the four cables 10 connected to the electrodes 41 on the front surface of the substrate 40 and of the four cables 10 connected to the electrodes 41 on the back surface of the substrate 40.

The number of the connection structures to be coupled is four in the present modification but may be six or more. Alternatively, the connection structures may not be coupled but formed integrally.

Effects of the Third Embodiment

The third embodiment achieves the following effects.

(1) It is possible to provide a connection structure which can prevent deterioration of transmission characteristics by preventing deformation and melting of an insulation during solder connection work, a connection method and a differential signal transmission cable.

(2) It is possible to simultaneously solder-connect multiple cables 10, which allows the workability to be improved.

Figure 5:
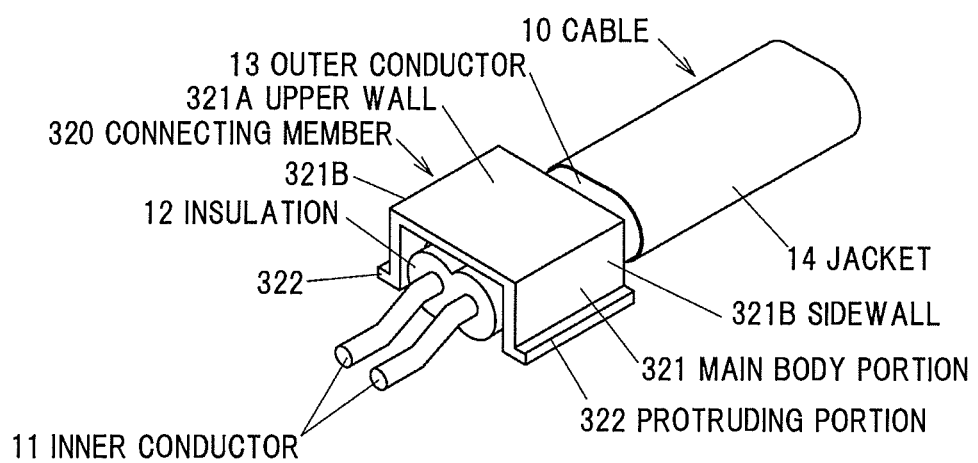
FIG. 5 is a perspective view showing an end portion of a differential signal transmission cable used in a connection structure in a fourth embodiment of the invention.

Fourth Embodiment
Structure of Differential Signal Transmission Cable Used in Connection Structure FIG. 5 is a perspective view showing an end portion of a differential signal transmission cable used in a connection structure in a fourth embodiment of the invention.

A differential signal transmission cable used in a connection structure in the fourth embodiment is provided with the cable 10 and a connecting member 320 connected to the outer conductor 13 exposed at one end of the cable 10 using the solder 30.

The connecting member 320 is provided with a main body portion 321 formed in a protective shape which prevents a soldering tool pressing load during solder connection to the outer conductor 13 from being applied to the outer conductor 13. The protective shape in the fourth embodiment is a recessed shape composed of an upper wall 321A facing the upper surface of the outer conductor 13 and sidewalls 321E facing the side surfaces of the outer conductor 13. Here, it is preferable that the upper wall 321A be not directly in contact with the upper surface of the outer conductor 13. In addition, it is preferable that the sidewalls 321B be not directly in contact with the side surfaces of the outer conductor 13.

The connecting member 320 is provided with protruding portions 322 and is connected to ground electrodes of a substrate via the protruding portions 322. The protruding portions 322 are formed to respectively protrude outwardly from the lowermost portions of the both sidewalls 321B. Although the shape of the protruding portion 322 is not specifically limited, it is desirable to form the protruding portion 322 throughout the entire longitudinal length of the sidewall 321B. A length of the protruding portion 322 is not specifically limited, neither, and it is possible to appropriately adjust the length.

The width of the upper wall 321A is adjusted in the same manner as the upper wall 21A in the first embodiment. In addition, the height of the sidewall 321B is adjusted in the same manner as the sidewall 21B in the first embodiment.

As a material of the connecting member 320, it is possible to use the same material as the connecting member 20 in the first embodiment.

Connection Procedure for Connection Structure

Figure 11A:
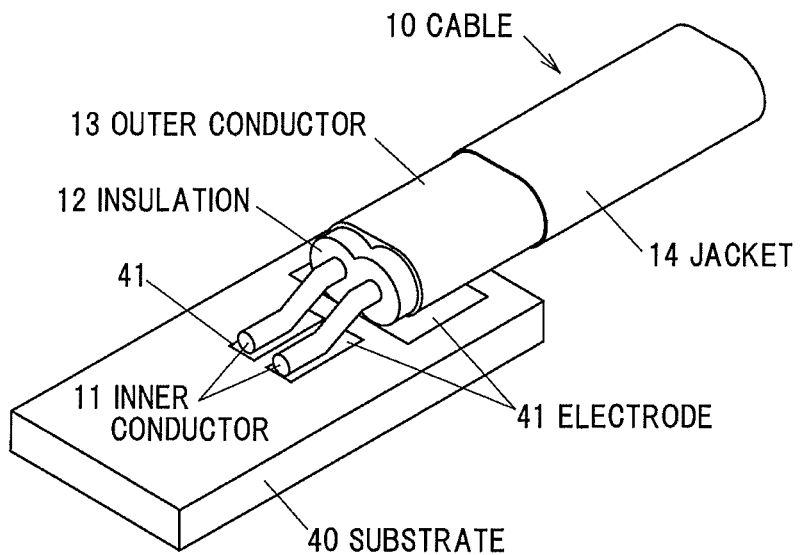
FIGS. 11A and 11B are explanatory diagrams illustrating a connection procedure for the connection structure in the fourth embodiment of the invention.
Figure 11B:
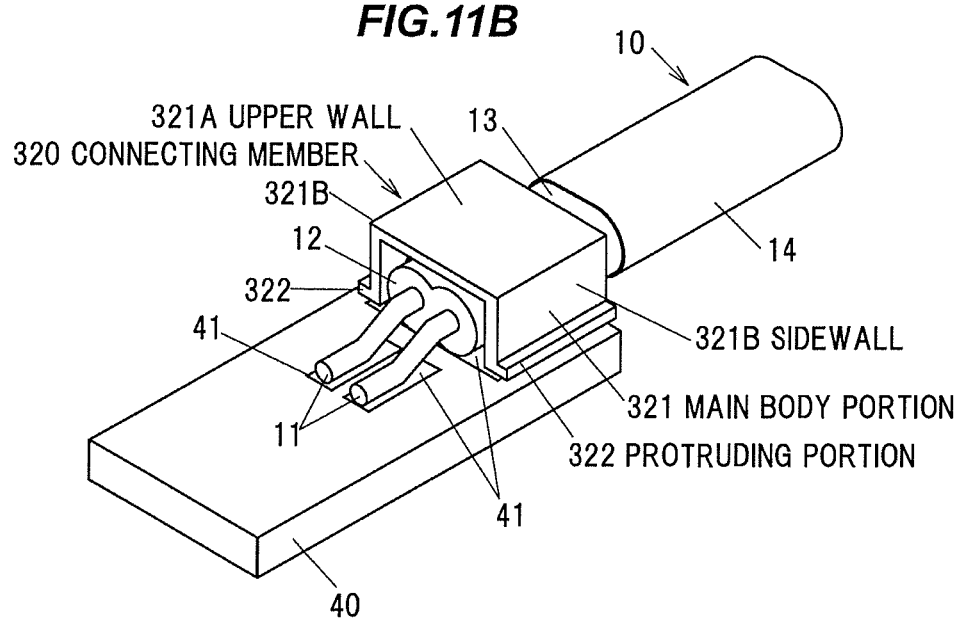

FIGS. 11A and 11B are explanatory diagrams illustrating a connection procedure for the connection structure in the fourth embodiment of the invention.

The connection procedure for the connection structure in the fourth embodiment of the invention may be such that the cable 10 to which the connecting member 320 shown in FIG. 5 is already connected using the solder 30 is connected to the substrate 40, or alternatively, the procedure may be such that, as shown in FIGS. 11A and 11B, the inner conductors 11 of the cable 10 are firstly connected to the electrodes 41 of the substrate 40 using a solder (not illustrated) (FIG. 11A) and connection of the outer conductor 13 of the cable 10 to the connecting member 320 and connection of the protruding portions 322 of the connecting member 320 to the electrodes (ground electrodes) 41 of the substrate 40 are subsequently carried out using a solder (not illustrated) (FIG. 11B).

For solder connection of the connecting member 320 to the outer conductor 13, it is preferable that the solder be melted by heating through the connecting member 320 in order to prevent deformation/melting of the insulation 12.

Effects of the Fourth Embodiment

The fourth embodiment achieves the following effects.

(1) It is possible to provide a connection structure which can prevent deterioration of transmission characteristics by preventing deformation and melting of an insulation during solder connection work, a connection method and a differential signal transmission cable.

(2) Since the contact area between the protruding portion 322 and the connecting member 320 is large, the protrusion is not damaged or bent at the time of placing the connecting member 320 on the cable 10 and it is possible to ensure high connection strength.

Other Embodiments of the Invention

Although the embodiments of the invention have been described, the invention is not intended to be limited to the embodiments, and the various kinds of modifications can be implemented without departing from the gist of the invention.

The connection structure in the embodiments of the invention only needs to be, e.g., a connection structure in which an outer conductor of a differential signal transmission cable is connected to a substrate via a connecting member provided with a main body portion and protruding portions protruding from the main body portion such that the connecting member is solder-connected to the outer conductor at the main body portion and is solder-connected to the substrate at the protruding portions, and the shape of the connecting member is not limited to those in the embodiments and may be various shapes.

EXAMPLES

A connecting member having a recessed shape (Example 1) and a connecting member having a trough shape (Example 2) as the first embodiment of the invention and a connecting member having a plate shape (using a jig) (Example 3) as the second embodiment of the invention were solder-connected to respective outer conductors, and an amount of collapse of an insulation (core) and variation in impedance were measured. Meanwhile, as a connection structure of the conventional technique, an outer conductor was directly soldered without using a connecting member (Comparative Example 1), and an amount of collapse of an insulation (core) and variation in impedance were measured in the same manner.

Figure 12A:
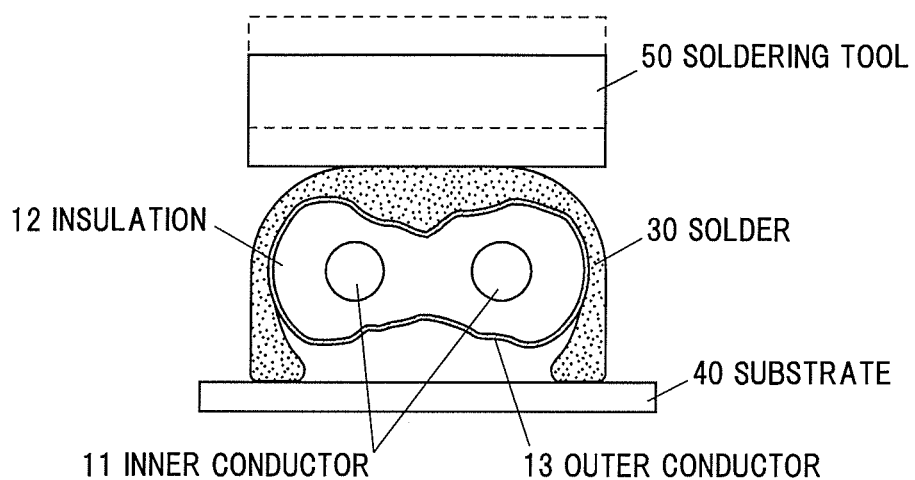
FIG. 12A is a conceptual cross-sectional view showing Comparative Example 1 (a connection structure of a conventional technique) at the time of pressing by a soldering tool and FIG. 12B is a conceptual cross-sectional view showing Example 1 (the modification of the connection structure in the first embodiment) at the time of pressing by the soldering tool.
Figure 12B:
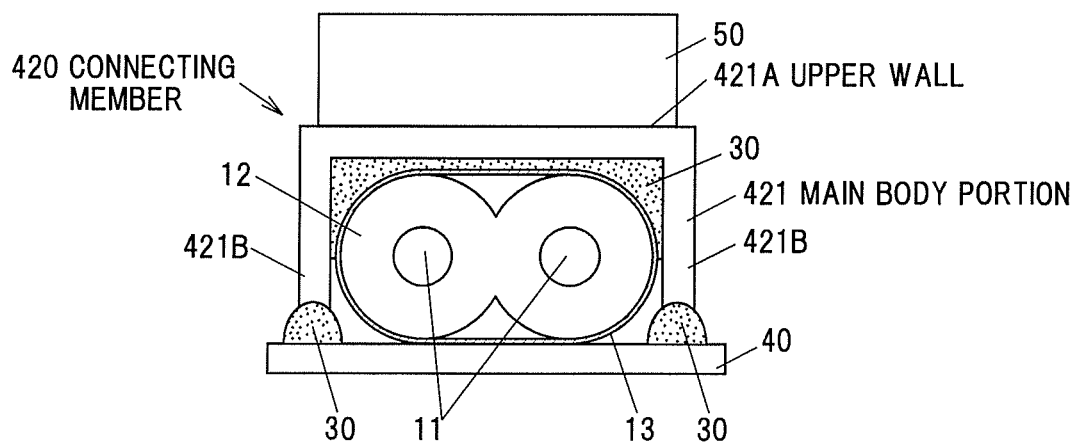

FIG. 12A is a conceptual cross-sectional view showing Comparative Example 1 (a connection structure of a conventional technique) at the time of pressing by a soldering tool and FIG. 12B is a conceptual cross-sectional view showing Example 1 (the modification of the connection structure in the first embodiment) at the time of pressing by the soldering tool.

FIG. 13 is a table showing test results of Examples 1 to 3 and Comparative Example 1. In addition, FIGS. 14A and 14B are explanatory diagrams illustrating an amount of collapse of an insulation, wherein FIG. 14A is a cross sectional view before pressing by the soldering tool and FIG. 14B is a cross sectional view after pressing by the soldering tool.

D shown in FIG. 14B is the amount of collapse of an insulation (core).

In Comparative Example 1, the insulation 12 was crushed and deformed, and also melted. On the other hand, in Examples 1 to 3, deformation and melting of the insulation 12 was significantly prevented as compared to Comparative Example 1. In addition, variation in impedance was also significantly prevented in Examples 1 to 3 as compared to Comparative Example 1.

What is claimed is:

1. A connection structure for connecting an outer conductor of a differential signal transmission cable to a substrate, comprising:
a connecting member comprising a main body portion and a protruding portion protruding from the main body portion,
wherein the outer conductor is connected via the connecting member to the substrate, and
wherein the connecting member is solder-connected to the outer conductor via the main body portion and is solder-connected to the substrate via the protruding portion, and
wherein the connecting member includes a sidewall and an upper wall, the sidewall having a height not less than a height of the cable, and the upper wall not directly in contact with an upper surface of the outer conductor, and wherein a solder connection is disposed between the upper wall and the upper surface of the outer conductor.

2. The connection structure according to claim 1, wherein the connecting member is not directly in contact with a side surface of the outer conductor.

3. The connection structure according to claim 1, wherein the main body portion of the connecting member comprises a protective shape formed so as to prevent a soldering tool pressing load from being applied to the outer conductor during a solder connection to the outer conductor.

4. The connection structure according to claim 3, wherein the protective shape comprises a recessed shape comprising said upper wall facing the upper surface of the outer conductor and a said sidewall facing the side surface of the outer conductor.

5. The connection structure according to claim 3, wherein the protective shape comprises a trough shape.

6. The connection structure according to claim 1, wherein the main body portion of the connecting member comprises a plate shape comprising said upper wall facing the upper surface of the outer conductor.

7. The connection structure according to claim 1, wherein the protruding portion is formed protruding substantially parallel to an inner conductor exposed at an end portion of the differential signal transmission cable.

8. The connection structure according to claim 7, wherein the protruding portion is formed protruding so as to be substantially at a same level as the inner conductor exposed at the end portion of the differential signal transmission cable.

9. The connection structure according to claim 1, wherein the protruding portion is formed protruding substantially orthogonal to the inner conductor exposed at an end portion of the differential signal transmission cable.

10. The connection structure according to claim 1, wherein the connecting member is solder-connected to each outer conductor of two or more differential signal transmission cables that are arranged in parallel.

11. The connection structure according to claim 1, wherein the connecting member is solder-connected to each outer conductor of a differential signal transmission cable connected to a front surface of the substrate and a differential signal transmission cable connected to a back surface of the substrate.

12. The connection structure according to claim 1, wherein the cable includes a pair of inner conductors covered by insulation, and the outer conductor and the sidewall of the connecting member is connected to the cable.

13. The connection structure according to claim 1, wherein a solder connection is also disposed between the sidewall of the connecting member and a side surface of the upper connector.

14. The connection structure according to claim 13, wherein the solder connection disposed between the upper wall and the sidewall of the connecting member and the the upper connector is a single continuous solder connection.

15. A differential signal transmission cable used for the connection structure according to claim 1, wherein the connecting member is solder-connected to the outer conductor exposed at one end or both ends of the cable.

* * * * *